US008193449B2

(12) United States Patent
Esmaili et al.

(10) Patent No.: US 8,193,449 B2
(45) Date of Patent: Jun. 5, 2012

(54) LOW INDUCTANCE BUSBAR

(75) Inventors: Gholamreza Esmaili, Torrance, CA (US); Konstantinos Triantos, Huntington Beach, CA (US); Constantin C. Stancu, Anaheim, CA (US); Larry A. Hagerty, San Pedro, CA (US); David Tang, Fontana, CA (US); Mark L. Selogie, Manhattan Beach, CA (US); Mark D. Korich, Chino Hills, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 900 days.

(21) Appl. No.: 12/250,259

(22) Filed: Oct. 13, 2008

(65) Prior Publication Data
US 2010/0089641 A1 Apr. 15, 2010

(51) Int. Cl.
*H02G 5/00* (2006.01)

(52) U.S. Cl. .................. 174/70 B; 174/72 B; 174/71 B; 174/99 B; 361/601; 361/611; 361/637

(58) Field of Classification Search ............... 174/137 B, 174/72 B, 71 B, 88 B, 70 B, 99 B, 129 B, 174/133 B, 149 B; 439/212, 213, 114; 361/675, 361/715, 306.1, 306.3, 600, 611, 637, 638, 361/639, 648, 601
See application file for complete search history.

(56) References Cited

U.S. PATENT DOCUMENTS

| 7,358,442 | B2 * | 4/2008 | Radosevich et al. ......... 174/68.2 |
| 7,798,833 | B2 * | 9/2010 | Holbrook .................... 174/72 B |
| 7,880,088 | B2 * | 2/2011 | Radosevich et al. ......... 174/68.2 |
| 7,907,385 | B2 * | 3/2011 | Korich et al. ............. 361/306.1 |
| 2008/0117602 | A1 | 5/2008 | Korich et al. | |

FOREIGN PATENT DOCUMENTS

| DE | 4412990 A1 | 10/1995 |
| DE | 19845821 A1 | 4/2000 |

OTHER PUBLICATIONS

Office Action dated Nov. 17, 2010, issued in German Patent Application No. 10 2009 028 907.0-32.
Caponet, M.G. et al., "Low Stray Inductance Bus Bar Deign and Construction for Good EMC Performance in Power Electronic Circuits," IEEE Transactions on Power Electronics, Mar. 2002, pp. 225-231, vol. 17, No. 2.
Dimino, C.A. et al., "A Low Inductance, Simplified Snubber, Power Inverter Implementation," HFPC Proceedings, ELDRE Corporation, Apr. 1994, pp. 502-509.
Prior Design by Nichicon of a power inverter assembly, printed on Oct. 8, 2008.

* cited by examiner

*Primary Examiner* — Angel R Estrada
(74) *Attorney, Agent, or Firm* — Ingrassia Fisher & Lorenz, P.C.

(57) ABSTRACT

A busbar assembly for an inverter module has a power module, a capacitor module with at least one capacitor, and a battery all interconnected by a busbar. The busbar includes a base busbar portion that is electrically coupled to the battery and a branch busbar portion that extends from the base busbar to the power module and that electrically connects to the capacitor module at points located between the base node and the power module.

26 Claims, 5 Drawing Sheets

US 8,193,449 B2

LOW INDUCTANCE BUSBAR

TECHNICAL FIELD

The present invention generally relates to automotive power inverter systems, and more particularly relates to a low inductance busbar for an automotive power inverter system.

BACKGROUND OF THE INVENTION

Electric and hybrid electric vehicles often use sources of high voltage such as battery packs or fuel cells that deliver direct current (DC) to drive vehicle motors, electric traction systems, and other vehicle systems. These systems typically include power inverters to convert the DC input from the power source to a 3-phase alternating current (AC) output compatible with electric motors and other electrical components. Such inverters generally include both power and capacitor modules interconnected by a busbar system that distributes current throughout the inverter. Such busbar systems often involve one or more intricately-designed electrodes that are generally joined together with a multitude of fasteners. This relatively complex busbar can add significantly to total part count and cost for materials and assembly.

Moreover, some conventional inverters have been observed to incur voltage spikes when currents flowing through the power module abruptly change, such as when the inverter is switched off. The magnitudes of these voltage spikes are related to the inductance of the busbar. More particularly, the relationship between inductance (L), current (i), voltage (V), and time (t) is described in equation (1):

$$V = L*(di/dt) \quad (1)$$

This equation demonstrates that voltage spikes are intensified for systems that have a high inherent inductance. That is, even relatively small changes in current can produce relatively large voltage spikes if the inductance is high. A busbar may contribute substantially to the total inductance of an inverter system because of the relatively long current pathway between its various input and output nodes.

Accordingly, it is desirable to provide a low inductance busbar system to reduce voltage spikes when power modules are switched off. Further, it is also desirable to provide a busbar system for distributing current within a power inverter that has fewer parts and minimizes material costs. Furthermore, other desirable features and characteristics of the present invention will become apparent from the subsequent detailed description and the appended claims, taken in conjunction with the accompanying drawings and the foregoing technical field and background.

SUMMARY OF THE INVENTION

According to various embodiments, a busbar assembly for an inverter module is provided. The inverter module has a power module comprising a first power module node and a second power module node, a capacitor module comprising an array of at least one capacitor, each capacitor of the capacitor module having a first capacitor node and a second capacitor node, and a battery comprising a first battery node and a second battery node. The busbar assembly comprises a base busbar and a branch busbar. The base busbar has a first base node electrically coupled to the first battery node, and a second base node electrically coupled to the second battery node. The branch busbar has a first branch node and a second branch node, wherein the first branch node extends from the first base node to the first power module node and electrically connects to the first capacitor module node at a first point between the first base node and the first power module node, and wherein the second branch node extends from the second base node to the second power module node and electrically connects to the second capacitor module node at a second point between the second base node and the second power module node.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following description refers to elements or nodes or features being "connected" or "coupled" together. As used herein, unless expressly stated otherwise, "connected" means that one element/node/feature is directly joined to (or directly communicates with) another element, node or other feature in a mechanical, logical, electrical or other appropriate sense. Likewise, unless expressly stated otherwise, "coupled" means that one element/node/feature is directly or indirectly joined to (or directly or indirectly communicates with) another element/node/feature in a mechanical, logical, electrical or other appropriate sense. The term "exemplary" is used in the sense of "example," rather than "model." Further, although the figures may depict example arrangements of elements, additional intervening elements, devices, features, or components may be present in a practical embodiment of the invention. Furthermore, the term "integrally formed" or "integrally connected" means that a first element/node/feature extends or transitions in a continuous manner from a second element/node/feature and not as two separate and distinguishable elements.

Figure 1:
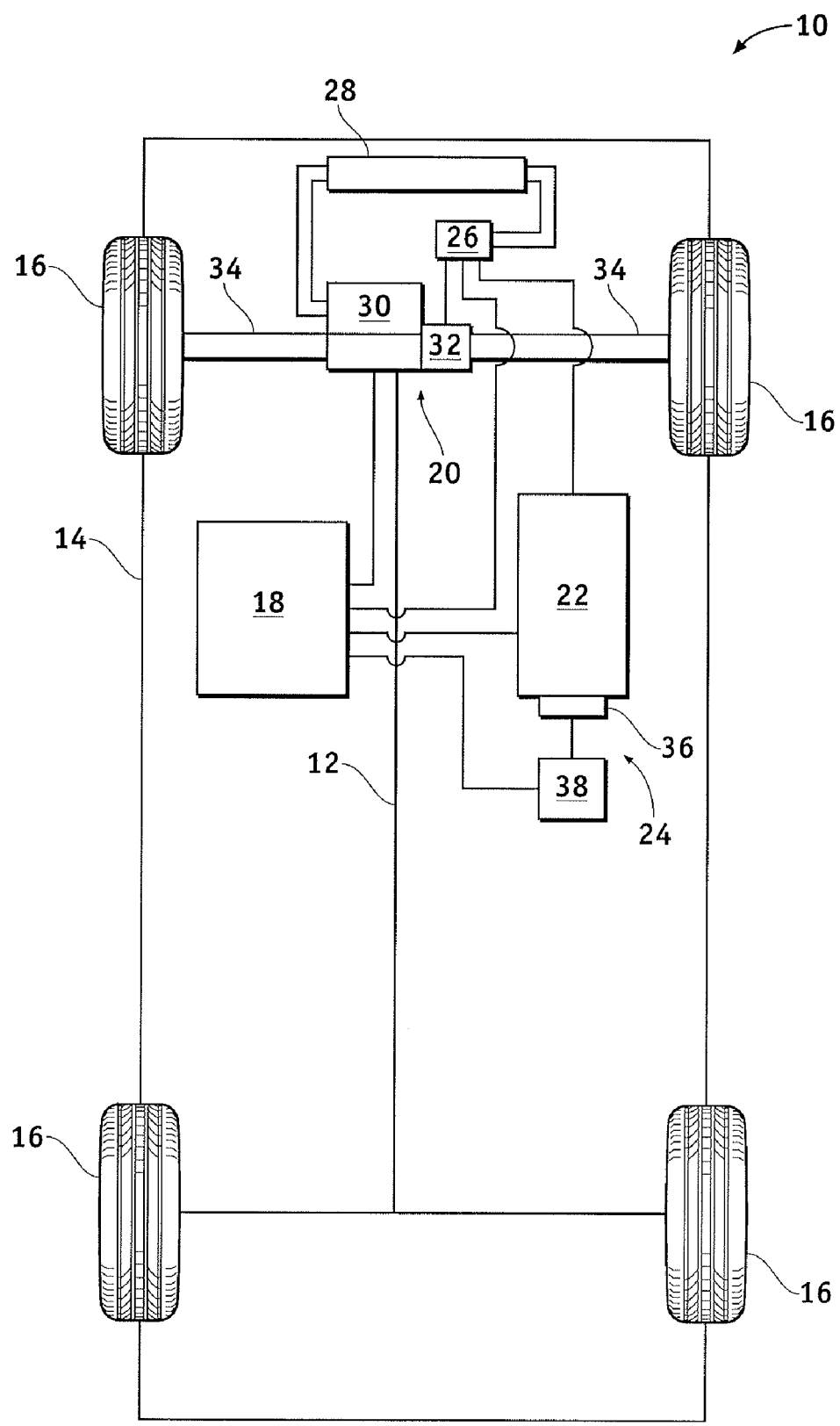
FIG. 1 is a schematic view of an exemplary automobile illustrating the manner in which an embodiment is integrated with various sub-components of an automobile.

FIG. 1 illustrates a vehicle 10, such as an automobile according to one embodiment of the present invention. Vehicle 10 includes a chassis 12, a body 14, four wheels 16, and an electronic control system (or electronic control unit (ECU)) 18. The body 14 is arranged on the chassis 12 and substantially encloses the other components of the automobile 10. The body 14 and the chassis 12 may jointly form a frame. The wheels 16 are each rotationally coupled to the chassis 12 near a respective corner of the body 14.

Vehicle 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). Vehicle 10 may also incorporate any one of, or combination of, a number of different types of engines (or actuators), such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, or a fuel cell, a combustion/electric motor hybrid engine, and an electric motor.

In the exemplary embodiment illustrated in FIG. 1, vehicle 10 is a hybrid vehicle that further includes an actuator assembly (or powertrain) 20, a battery 22, a battery state of charge (SOC) system 24, a power inverter 26, and a radiator 28. The actuator assembly 20 suitably includes an internal combustion engine 30 and an electric motor/generator (or motor) system (or assembly) 32. The battery 22 is electrically connected to the power inverter 26 and, in one embodiment, is a lithium ion (Li-ion) battery including any number of cells, as is commonly understood.

In general, a power inverter includes a busbar assembly that includes at least one busbar to provide a conductive pathway for current to flow between electronic components such as a DC source, a capacitor module, and/or a power module assembly. Such a busbar typically has a laminar structure or the like that includes positive and negative electrically conducting outer layers or "nodes" that are electrically insulated from each other by a non-conducting center layer. The busbar assembly may be configured as desired to compactly fit between capacitor and power modules and to shorten the current pathway between these components to minimize the overall system inductance.

Figure 2:
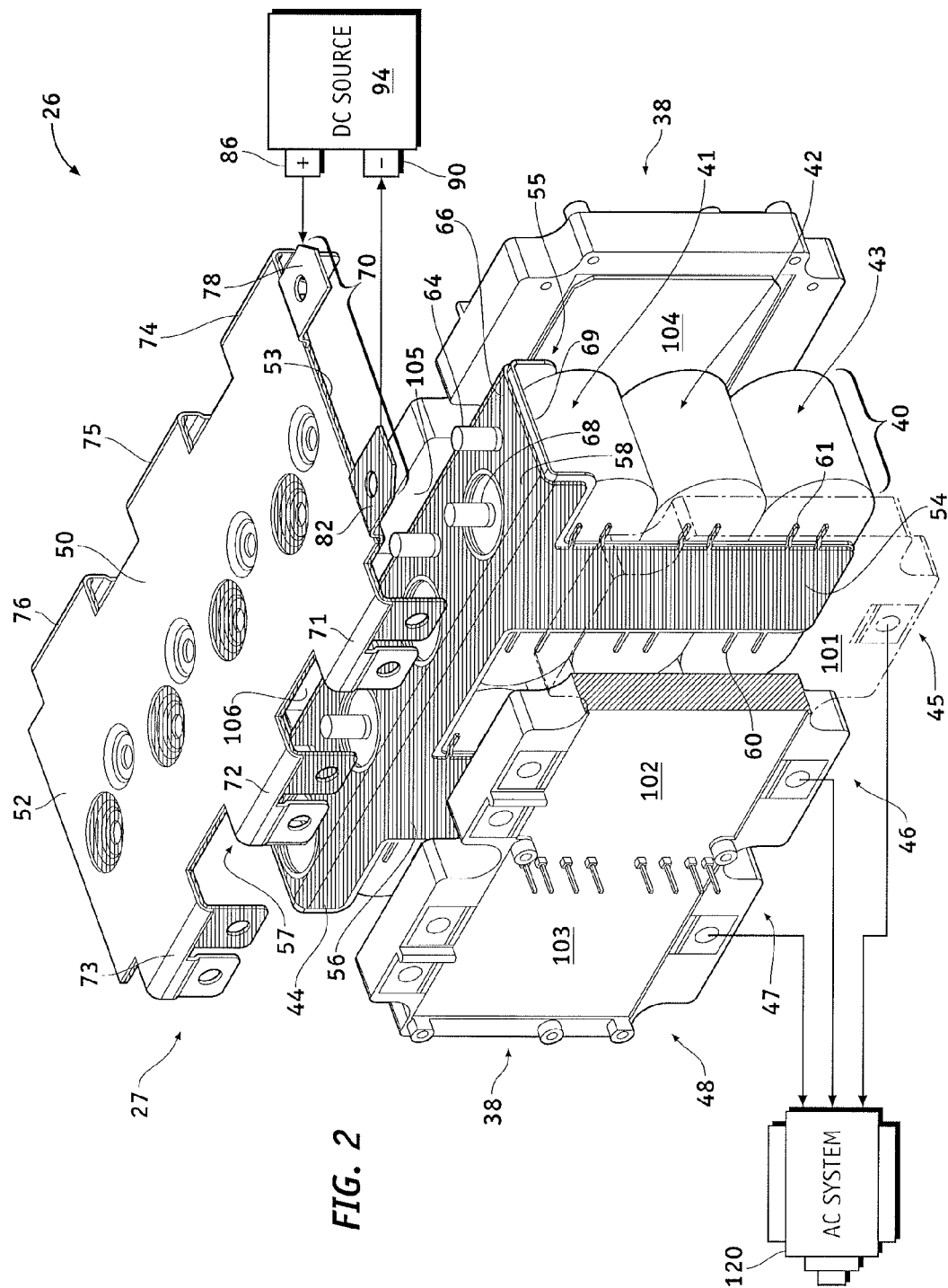
FIG. 2 is a schematic drawing illustrating an exemplary power inverter having a bus bar assembly.

FIG. 2 is a schematic drawing of an exemplary power inverter assembly 26. Power inverter assembly 26 suitably includes a capacitor module 40, a busbar assembly 27, and a power module assembly 38 that includes any number of individual power modules. As shown in FIG. 2, power module assembly 38 is configured with six power modules, 101-106, and with power module 101 depicted in outline form to more clearly represent other components of inverter assembly 26. Capacitor module 40 suitably includes any number of individual capacitors, and may be arrayed in any manner. As shown in FIG. 2, for example, capacitor module 40 includes twelve bipolar capacitors arranged in three rows 41, 42, and 43, and four columns 45, 46, 47, and 48, with capacitors oriented with like polarities facing in the same direction within any column and alternating in any row. Busbar assembly 27 as shown in FIG. 2 includes a first busbar 44 that is electrically coupled to each individual capacitor of capacitor module 40, and a second busbar 50 that connects to both a DC source 94 and to each power module of power inverter assembly 26. The two busbars are electrically coupled together to provide a pathway for electrical current to flow between the DC source 94, power inverter 26 and/or capacitor module 40.

Referring to FIG. 2, first busbar 44 includes a base busbar 58 with a laminar, binodal structure, having a positive node 69 and a negative node 66 electrically separated by a non-conducting insulating layer as will be described in greater detail below, and is disposed horizontally along, and parallel to, the top of first capacitor module row 41. Base busbar 58 is integrally connected to and electrically continuous with a first extension 54 and a second extension 55 (shown in cross-section in FIG. 3) that each run vertically, together straddling first and second columns 45 and 46 of capacitor module 40. Base busbar 58 may also be connected to a third extension 56 and to a fourth extension 57 (not shown) that similarly straddle third and fourth columns 47 and 48. Each of extensions 54-57 has the same laminar, binodal structure as base busbar 58, and extends electrical continuity for both positive and negative nodes therefrom. While first busbar 44 is shown in FIG. 2 as having four extensions, alternate embodiments may be configured with additional extensions as needed depending on the number of columns in capacitor module 40. Extension nodes are electrically coupled to like capacitor nodes by positive and negative finger sets 60 and 61, respectively, using solder or the like in any conventional manner.

Second busbar 50 also includes a laminar, binodal structure having a positive node 52 and a negative node 53 separated by an insulating interlayer. Second busbar 50 may be connected to base busbar 58 by electrically conducting studs. In various embodiments, a first set of negative studs 64 mechanically and electrically couple negative nodes 66 and 53 of base busbar 58 and second busbar 50, respectively. Negative studs 64 are electrically isolated from the various nodes of the opposing polarity (e.g., the positive nodes in this example). Similarly, a second set of positive studs 68, is electrically isolated from all negative nodes, and mechanically and electrically couple together positive nodes 69 and 52 of base and second busbars 58 and 50, respectively. Threaded nuts (not shown) or any suitable fastener may be used in conjunction with threaded studs 64 and 68 to apply clamping force, buttressing both electrical continuity and mechanical stability of associated busbars. Second busbar 50 includes seven tab pairs, 70-76, for providing electrical connection to source 94 and individual power modules of power module assembly 38. First tab pair 70 includes first positive and negative tabs 78 and 82, respectively, electrically coupled with like poles 86 and 90 of DC source 94. Tab pairs 71-73 and 74-76 are disposed symmetrically along opposing sides of second busbar 50, and may be coupled to a power module to provide a DC input signal thereto. Power module assembly 38 may include any number of individual power modules, and may, for example, be arrayed as shown in two sets of three each, 101-103 and 104-106, each set symmetrically disposed on opposing sides of second busbar 50 and coupled to provide a 3-phase AC output signal to a device such as an electric motor 120.

When interconnected, first and second busbars 44 and 50 are configured to electrically couple the positive nodes of individual capacitors of module 40 and power modules 101-106 with positive node 86 of DC source 94, biasing each with an input DC voltage, and to provide a return current pathway from the negative nodes of these components to the negative node 90 of source 94. For example, during operation, current may be injected by source 94 into first positive tab 78 and flow through second busbar positive node 52, positive stud set 68, and first busbar positive node 69. Current may then flow into the positive node of first extension 54, through positive finger set 60 into the positive nodes of capacitors in second column 46, where it is capacitively discharged from negative capacitor nodes flowing to the negative node (not shown) of second extension 55. Current flow may continue through the negative node 66 of base busbar 58 and pass via physical contact and through negative stud set 64 into the negative node 53 of second busbar 50. Current flows to the negative pole of tab pairs 70-76 and into power modules 101-106 and negative pole 90 of DC source 94. Each bank of three power modules 101-103 and 104-106 converts the input DC signal to a 3-phase, AC output directed to, for example, motor 120.

Figure 3:
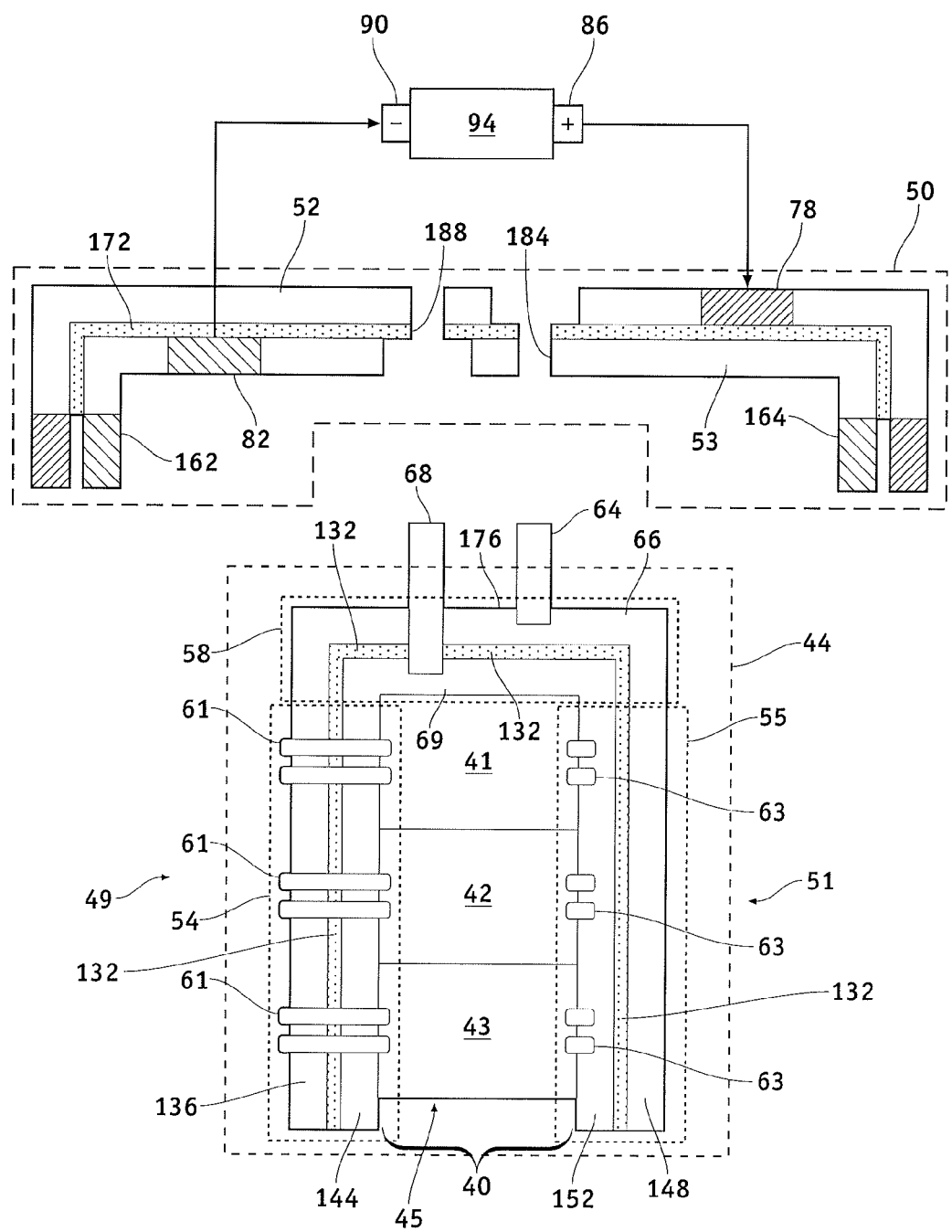
FIG. 3 schematically illustrates an exemplary busbar assembly.

FIG. 3 is a cross-sectional, schematic drawing illustrating first busbar 44 and second busbar 50 electrically coupled to a capacitor module 40, and compactly arranged to reduce current path length and lower inductance thereby. First busbar 44 has a laminar, binodal structure and includes base busbar 58 having negative node 66 and positive node 69. First extension 54 and second extension 55 are each integrally connected to base busbar 58 maintaining the same electrically continuous, laminar, and binodal structure described above. Extensions 54 and 55 span vertically along first and second sides 49 and 51, respectively, of capacitor module 40, together straddling columns 45 and 46 (shown in FIG. 2). First extension 54 has a negative node 136 electrically coupled via negative finger set 61 to the negative nodes of each capacitor in column 45 and a positive node 144 electrically coupled to the positive nodes of each capacitor in column 46 (shown in FIG. 2). Similarly, second extension 55 has a negative node 148 electrically coupled to the negative nodes of each capacitor in column 46 (not shown) and a positive node 152 electrically coupled via a third finger set 63 to the positive nodes of each capacitor in column 45. The positive and negative nodes of base busbar 58, and extensions 54 and 55 are separated (electrically isolated) from each other by a continuous first insulating layer 132.

Still referring to FIG. 3, second busbar 50 also includes a binodal, laminar structure having positive node 52 and negative node 53 coupled on either side of a second insulating layer 172. As previously described, second busbar 50 is coupled to receive a first input from positive pole 86 of DC source 94 via first positive tab 78, and to receive a second input from a negative pole 90 of DC source 94 via first negative tab 82. Negative stud set 64 passes through insulated openings 184 in second busbar 50, mechanically and electrically coupling the negative nodes 66 and 53 of base and second busbars 58 and 50, respectively, using suitable fasteners (not shown). Positive stud set 68 passes through insulated openings 188 in second busbar 50 and similarly couples the positive nodes 69 and 52 of base and second busbars 58 and 50, respectively. During operation, source 94 biases first positive tab 78 with a DC voltage signal, injecting current into second busbar positive node 52 and base busbar 58 positive node 69 via positive stud set 68. Current may flow into positive node 152 of second extension 55 and through third finger set 63 into the positive nodes of capacitors in first column 45. Current is capacitively discharged and flows through negative finger set 61 into negative node 136 of first extension 54, negative node 66 of base busbar 58, and to negative node 53 of second busbar 50 via negative stud set 64. Current enters power modules 101 and 104 (shown in FIG. 2) and negative pole 90 of DC source 94 via tabs 162, 164, and 82 respectively. Base and second busbars 58 and 50 distribute current to each of the remaining power modules 102, 103, 105, and 106 in a similar manner.

Figure 4:
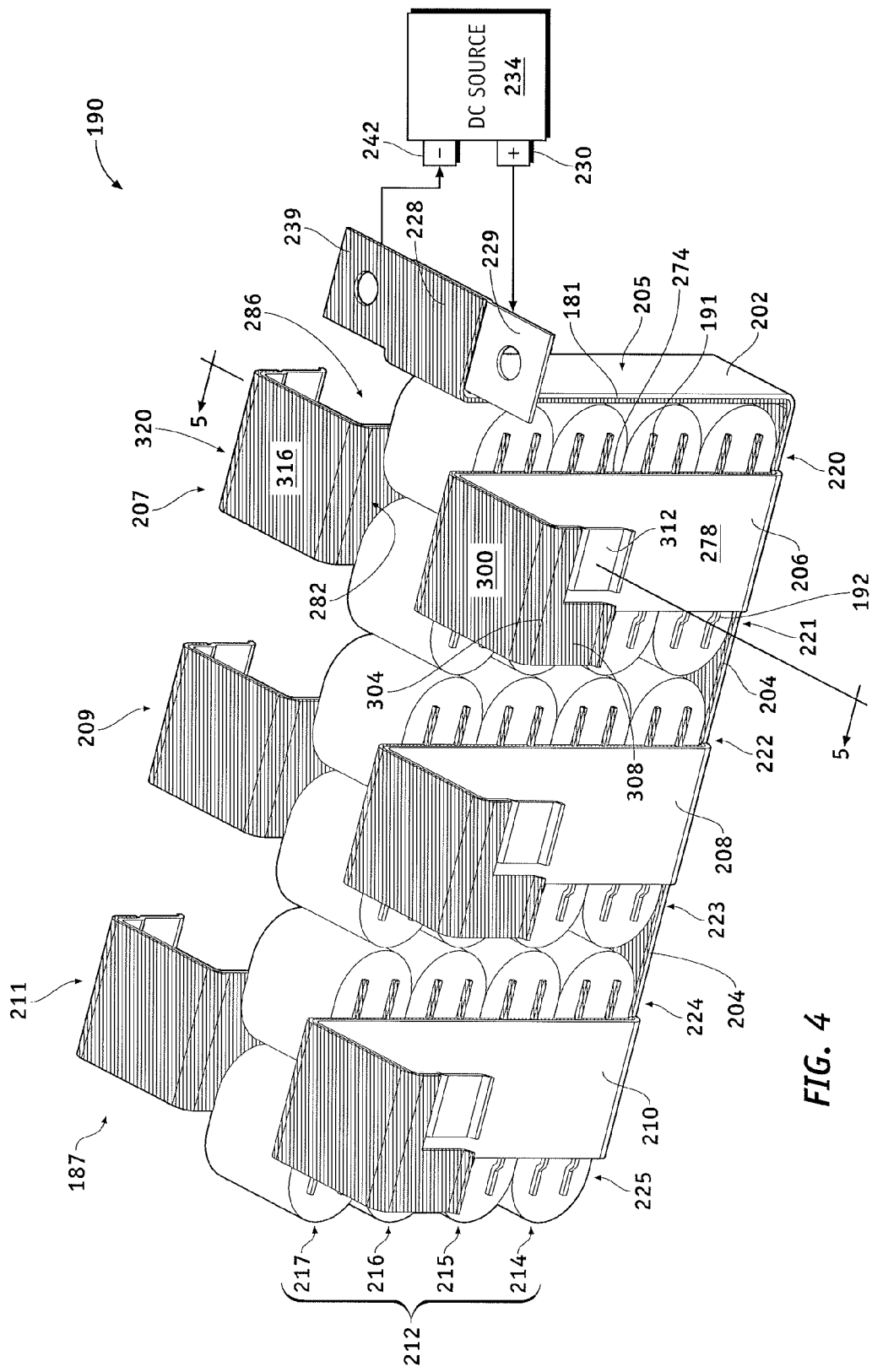
FIG. 4 schematically illustrates another exemplary busbar assembly.

FIG. 4 is an isometric drawing illustrating selected components of an inverter assembly 190 including a capacitor module 212 and a busbar assembly 187 in accordance with another exemplary embodiment. For simplicity, and to better illustrate other components of inverter assembly 190, individual power modules have been omitted from FIG. 4. Busbar assembly 187 is configured for a reduced overall inductance by shortening the current pathway between input and output nodes of source, capacitor, and power modules. Further, busbar assembly 187 is contoured to electrically access these components without need for multiple individual busbars and connecting fasteners, thereby minimizing material use, part count, and assembly complexity. Busbar assembly 187 includes an electrically continuous binodal, laminar structure consisting of two parallel sheets of an electrically conducting material bonded to, and electrically isolated by an interposed insulating layer. The two conducting layers form the positive and negative nodes of the busbar and typically comprise copper or a copper alloy, and the insulating layer typically comprises Mylar (biaxially-oriented polyethylene terephthalate—boPET) polyester film or Nomex paper. In one embodiment, conducting layers (nodes) of busbar assembly 187 are constructed of 110 ETP copper having a thickness of from about 0.5 mm to about 3.0 mm, separated by a sheet of Mylar film having a thickness of from about 0.1 mm to about 1.0 mm. In another embodiment, busbar nodes have a thickness of about 1.0 mm and are separated by a Mylar film having a thickness of about 0.2 mm. In a further embodiment, the copper nodes also comprise a thin coating of plated tin.

Referring again to FIG. 4, capacitor module 212 may include any number of individual capacitors, and may be arranged, for example, as shown with 24 individual, bipolar capacitors arranged in a planar array having first through fourth rows 214-217 and first through sixth columns 220-225. Capacitors in module 212 are oriented having like polarity facing in the same direction within each column and alternating polarity across each row. Busbar assembly 187 includes a base busbar 204, a source extension 205 configured to be electrically coupled to a DC source, and lateral extensions 206-211, each configured for electrical coupling to individual capacitors of module 212. While six lateral extensions are shown, busbar assembly 187 may be alternately configured with any number of lateral extensions as needed to accommodate a particular configuration of capacitor module 212. Base busbar 204 is disposed adjacent and parallel to the underside of first row 214, and is integrally connected to source extension 205 running upward along the end of first column 220. Source extension 205 includes a binodal structure having positive node 202 and a negative node 181, and may be further configured with a binodal source projection 228 terminated by positive and negative source tabs 229 and 239, respectively, for convenient electrical coupling to a DC source node. For example, positive source tab 229 may be coupled to receive a first input from a positive node 230 of a DC source 234, and negative source tab 239 may be similarly coupled to receive a second input from a negative node 242 of source 234.

Lateral extensions 206-211 are each integrally connected to base busbar 204 and arranged with three extensions on each side. Each of lateral extension pairs 206/207, 208/209, and 210/211 straddles two adjacent capacitor columns and provides electrical coupling to individual capacitors therein. Because these lateral extension pairings are alike except for their position along capacitor module 212, only first extension 206 and second extension 207 will be described. These extensions span vertically upward from base busbar 204, together straddling first and second columns 220 and 221 of capacitor module 212. First lateral extension 206 has a negative node 274 electrically coupled to negative capacitor nodes in first column 220 by a first finger set 191. Similarly, first lateral extension 206 has a positive node 278 electrically coupled to the positive capacitor nodes of second column 221 via a second finger set 192. Second lateral extension 207 has a negative node 282 electrically coupled to the negative capacitor nodes in second column 221, and a positive node 286 electrically coupled to positive capacitor nodes in first column 220. First and second finger sets 191 and 192, respectively, interconnect extension/capacitor nodes using solder or the like in any conventional manner.

A first projection 300 is formed integrally with and extends substantially orthogonally from first lateral extension 206, directed outward from capacitor module 212. A first terminal 304 is integrally formed with first projection 300 and is oriented substantially parallel to first lateral extension 206 and substantially orthogonal to first projection 300, extending downward toward base busbar 204. First projection 300 and first terminal 304 each have a binodal, laminar structure that extends the positive and negative nodes of first lateral extension 206. A first positive tab 312 and a first negative tab 308 extend from the positive and negative nodes, respectively, of first terminal 304 and are each configured for electrical coupling to the input nodes of a power module. Similarly, a second projection 316, a second terminal 320, and second positive and negative tabs 324 and 328 (shown in FIG. 5) extend in sequence from second lateral extension 207 and are configured for binodal electrical coupling to another power module. While each segment of busbar assembly 187 is shown as oriented substantially orthogonal to a connecting segment, other orientations are possible depending upon on the configuration of associated capacitor and/or power modules, spatial considerations, and the like.

Figure 5:
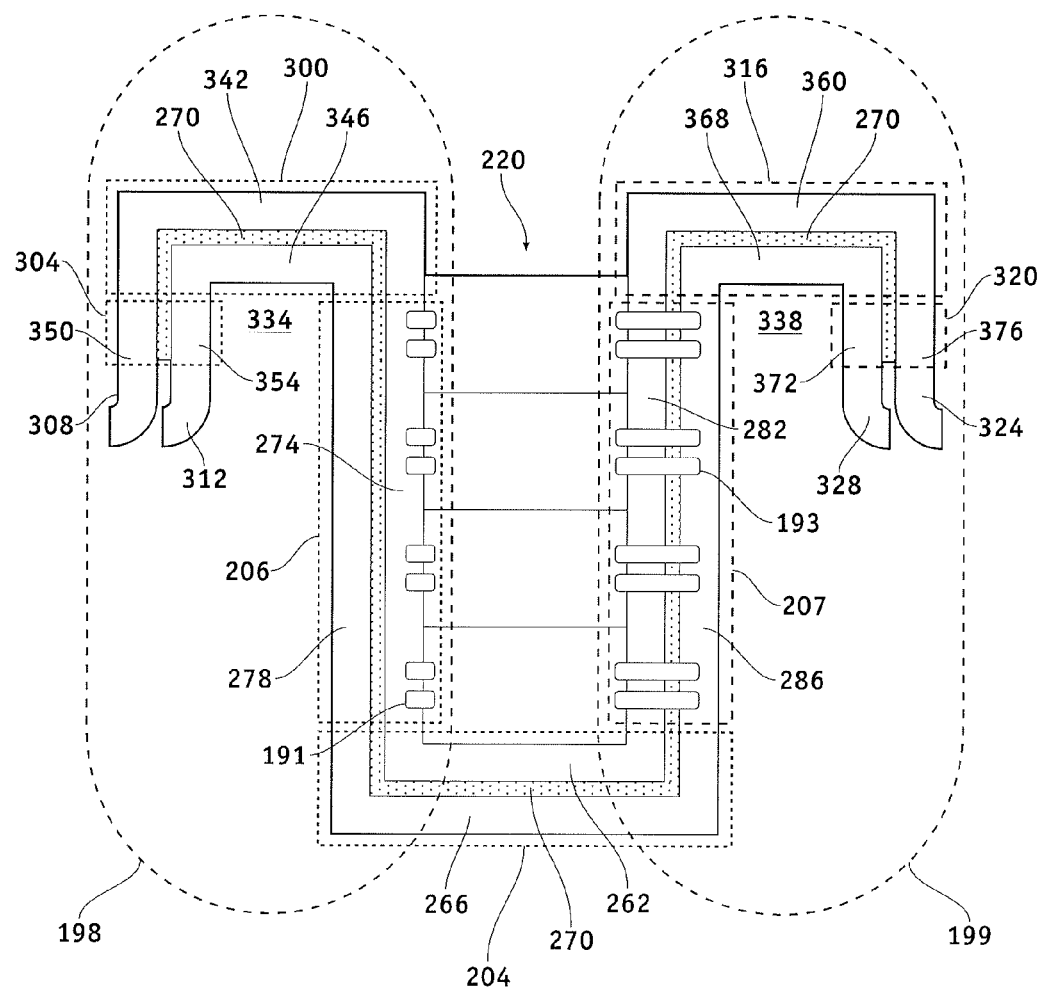
FIG. 5 schematically illustrates in cross-section another exemplary busbar assembly.

FIG. 5 illustrates schematically, in cross section, base busbar 204, first and second lateral extensions 206 and 207, and first capacitor module column 220 in accord with the present exemplary embodiment. Base busbar 204 includes a laminar, binodal structure having a base negative node 262 and a base positive node 266 separated by an insulating layer 270. First and second lateral extensions 206 and 207 are integrally connected to base busbar 204 and extend substantially vertically therefrom, together straddling first column 220 and second column 221 (shown in FIG. 4) of capacitor module 212. First lateral extension 206 has a first negative node 274 electrically coupled to negative capacitor nodes in first column 220 via first finger set 191. Similarly, first lateral extension 206 has a first positive node 278 electrically coupled to the positive capacitor nodes in second column 221 via second finger set 192 (shown in FIG. 4). Second lateral extension 207 has a second negative node 282 electrically connected to negative capacitor nodes in second column 221 (not shown), and a second positive node 286 electrically connected to positive capacitor nodes in first column 220 via a third finger set 193.

First projection 300 extends from the top edge of first lateral extension 206 forming an L-shape therewith, and extending horizontally away from capacitor module 212. First projection 300 has a first negative node 342 and a first positive node 346 that are electrically connected to first negative and positive nodes 274 and 278, respectively, of first lateral extension 206. First terminal 304 extends downward from first projection 300, and has first negative and positive nodes 350 and 354 integrally connected with first projection negative and positive nodes 342 and 346, respectively. First terminal negative and positive nodes 350 and 354 end in first negative and positive tabs 308 and 312, respectively, each tab configured to couple to a power module.

Second projection 316 is coupled to the top edge of second lateral extension 207 forming an L-shape therewith, and having second positive and negative nodes 368 and 360, respectively, electrically continuous with like nodes of second lateral extension 207. Second projection 316 is coupled to second terminal 320 having positive and negative nodes 372 and 376, respectively, and extending vertically downward, ending in second positive and negative tabs 328 and 324, respectively. Together, first lateral extension 206, first projection 300, and first terminal 304 form an inverted, asymmetric U-shaped first branch busbar 198 that mirrors a similar inverted, asymmetric U-shaped second branch busbar 199 formed by the combination of second lateral extension 207, second projection 316, and second terminal 320. The combination of base busbar 204 with branches 198 and 199 provides continuous, binodal electrical continuity having nodes separated by a single, continuous insulating layer 270. Further, the asymmetric inverted U-shape of each branch busbar creates first and second gaps 334 and 338, respectively, wherein power modules (not shown) may be disposed and conveniently connected to nearby tabs. Tabs 308/312 and 324/328 are each configured with fastener openings, clips, or the like for such electrical connection. Extensions 208-211 are each integrally connected to base busbar 204, and are configured in a manner similar to first and second lateral extensions 206 and 207; each having a projection, a terminal, and positive/negative tabs coupled to form inverted, asymmetric U-shaped branch busbars to provide binodal, electrical coupling to additional power modules.

Referring to FIGS. 4 and 5, during operation, busbar assembly 187 distributes current received from DC source 234 to each capacitor of module 212, and transfers the capacitively discharged output signal to power modules (not shown). The shortened current pathway from source to capacitor input, and from capacitor output to power module reduces overall system inductance and minimizes materials usage. For example, current may be injected by source 234 into first positive source tab 229, where it flows through the positive nodes of source extension 205 and base busbar 204. Current then divides between the positive nodes of each of lateral extensions 206-211. For simplicity, only the current pathway that includes lateral extensions 206 and 207 will be described. Current flows through each extension to the positive nodes of each capacitor in first and second columns 220 and 221 via finger sets 193 and 192, respectively. Current capacitively discharges to negative nodes 274 and 282, respectively, of first and second lateral extensions 206 and 207, and finally flows through the negative nodes of first and second projections 300 and 316 and first and second terminals 304 and 320 to tabs 308 and 324. Power modules, coupled in groups of three along the sides of capacitor module 212, together generate a 3-phase, AC output signal directed to an AC vehicular system.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An inverter module, comprising:
    a power module comprising: a first power module node and a second power module node;
    a capacitor module comprising: an array of at least one capacitor, each capacitor of the capacitor module having a first capacitor node and a second capacitor node;
    a battery comprising a first battery node and a second battery node; and
    a busbar assembly comprising:
        a base busbar having a first base node electrically coupled to the first battery node, and a second base node electrically coupled to the second battery node; and
        a branch busbar extending from the base busbar and having a first branch node and a second branch node,
            wherein the first branch node extends from the first base node to the first power module node and electrically connects to the first capacitor node of at least one capacitor at a first point physically located in between the first base node and the first power module node, wherein the first branch node is physically located between the first capacitor node and the first power module node, and
            wherein the second branch node extends from the second base node to the second power module node and electrically connects to the second capacitor node of at least one capacitor at a second point physically located in between the second base node and the second power module node, wherein the second branch node is physically located between the second capacitor node and the second power module node.

2. An inverter module according to claim 1, wherein the first base node and the first branch node are integrally formed with each other, and the second base node and the second branch node are integrally formed with each other.

3. An inverter module according to claim 1, wherein the branch busbar is one of a plurality of branch busbars.

4. An inverter module according to claim 1, wherein the branch busbar further comprises an extension busbar, a projection busbar, and first and second tabs.

5. An inverter module according to claim 4, wherein the extension busbar comprises a first extension node integrally formed with the first base node and connected to the first capacitor node of at least one capacitor in the capacitor module, and a second extension node integrally formed with the second base node and connected to the second capacitor node of at least one capacitor in the capacitor module.

6. An inverter module according to claim 4, wherein the extension busbar extends from the base busbar, the projection busbar extends from extension busbar, and the first and second tabs extend from the projection busbar, each in a substantially orthogonal manner.

7. An inverter module according to claim 4, wherein the projection busbar has a first projection node integrally formed between the first extension node and the first tab, and a second projection node integrally formed between the second extension node and the second tab.

8. An inverter module of claim 7, further comprising a terminal busbar having a first terminal node integrally formed between the first projection node and the first tab, and a second terminal node integrally formed between the second projection node and the second tab.

9. An inverter module according to claim 4, wherein the first and second tabs are electrically connected to the first power module node and the second power module node, respectively.

10. An inverter module according to claim 1, further comprising a first set of fingers and a second set of fingers, wherein the first set of fingers is integrally formed with the first branch node and electrically connects the first branch node to the first capacitor node of at least one capacitor from the capacitor module, and the second set of fingers is integrally formed with the second branch node and electrically connects the second branch node to the second capacitor node of at least one capacitor from the capacitor module.

11. An inverter module according to claim 1, wherein the base busbar and the branch busbar each further comprise an insulating layer configured to provide electrical insulation between the first and second nodes of each busbar.

12. An inverter module according to claim 1, further comprising a source busbar having a first source node and a second source node, wherein the first source node extends from the first base node and is electrically coupled to the first battery node, and the second source node extends from the second base node and is electrically coupled to the second battery node.

13. An inverter module according to claim 12, wherein the first base node and the first source node are integrally formed with each other, and the second base node and the second source node are integrally formed with each other.

14. An inverter module according to claim 12, wherein the source busbar comprises a source extension busbar having a first source extension node and a second source extension node, wherein the first source extension node extends from the first base node and is electrically coupled to the first battery node, and the second source extension node extends from the second base node and is electrically coupled to the second battery node.

15. An inverter module according to claim 14, wherein the source busbar further comprises a source projection busbar having a first source projection node and a second source projection node, wherein the first source projection node extends from the first source extension node and is electrically coupled to the first battery node, and the second source projection node extends from the second source extension node and is electrically coupled to the second battery node.

16. An inverter module according to claim 15, wherein the source busbar comprises a first source tab and a second source tab, wherein the first source tab extends from the first source projection node and is electrically coupled to the first battery node, and the second source tab extends from the second source projection node and is electrically coupled to the second battery node.

17. An inverter module according to claim 16, wherein the first base node, the first source extension node, the first source projection node, and the first source tab are integrally formed with each other, and the second base node, the second source extension node, the second source projection node, and the second source tab are integrally formed with each other.

18. A vehicular inverter module assembly, comprising:
a power module array comprising: at least one power module, each power module of the power module array comprising a first power module node and a second power module node;
a capacitor module comprising: at least one capacitor, each capacitor comprising a first capacitor node and a second capacitor node;
a DC source comprising: a first DC source node and a second DC source node; and
a busbar, comprising:
a base portion comprising: a first base node electrically coupled to the first DC source node, and a second base node electrically coupled to the second DC source node;
a source branch portion comprising: a first source branch node that extends from the first base node to the first DC source node, and a second source branch node that extends from the second base node to the second DC source node; and
a lateral branch portion comprising:
a first lateral branch node electrically connected to the first base node, the first capacitor node of at least one capacitor, and the first power module node of at least one power module, wherein the first lateral branch node is physically located between the first capacitor node and the first power module node; and
a second lateral branch node electrically connected to the second base node, the second capacitor node of the at least one capacitor, and the second power module node of the at least one power module, wherein the second lateral branch node is physically located between the second capacitor node and the second power module node.

19. An assembly according to claim 18, wherein the lateral branch portion comprises a lateral extension, a projection, and a terminal configured to form an asymmetric, inverted U-shape.

20. An assembly according to claim 18, wherein the lateral branch portion is one of a plurality of lateral branch portions.

21. An assembly of claim 18, wherein the source branch portion comprises a source extension formed integrally with and extending substantially orthogonally from the base portion, and a source projection formed integrally with and extending substantially orthogonally from the source extension.

22. An assembly of claim 21, wherein the source projection comprises a first source projection node and a second source projection node, and further comprising a first source tab extending from the first source projection node and electrically coupled to the first DC source node, and a second source tab extending from the second source projection node and electrically coupled to the second DC source node.

23. A vehicle inverter module, comprising:
   a power module array comprising six power modules, each power module of the power module array having a first power module node and a second power module node;
   a capacitor module comprising a four row, six column array of capacitors, each capacitor of the capacitor module having a first capacitor node and a second capacitor node;
   a DC source comprising a first DC source node and a second DC source node; and
   a busbar assembly, comprising:
   a base busbar having first, second, and third edges, the base busbar having a first base node electrically coupled to the first DC source node, and a second base node electrically coupled to the second DC source node;
   a source extension formed integrally with and extending from the first edge of the base busbar, the source extension having a first source extension node and a second source extension node, wherein the first source extension node extends from the first base node and is electrically coupled to the first DC source node, and the second source extension node extends from the second base node and is electrically coupled to the second DC source node; and
   a plurality of lateral branches formed integrally with the base busbar and physically located between the power module array and the capacitor module, each lateral branch comprising:
   an extension having a first extension node formed integrally with and electrically connected to the first base node and electrically coupled to the first capacitor node of at least one capacitor from the capacitor array, and a second extension node formed integrally with and electrically connected to the second base node and electrically coupled to the second capacitor node of at least one capacitor from the capacitor array;
   a projection having a first projection node formed integrally with and electrically connected to the first extension node, and a second projection node formed integrally with and
   electrically connected to the second extension node; and
   a terminal having a first terminal node formed integrally with and electrically connected to the first projection node and electrically coupled to the first power module node of one power module of the power module array, and a second terminal node formed integrally with and electrically connected to the second projection node and electrically coupled to the second power module node of one power module of the power module array;
   wherein a first subset of the plurality of lateral branches extends from the second edge of the base busbar, and a second subset of the plurality of lateral branches extends from the third edge of the base busbar.

24. A vehicle inverter module of claim 23, further comprising a first tab formed integrally with the first terminal node and electrically connected to the first power module node, and a second tab formed integrally with the second terminal node and electrically connected to the second power module node.

25. A vehicle inverter module of claim 23, wherein the first subset and the second subset each contain the same number of lateral branches.

26. A vehicle inverter module of claim 23, wherein the first subset and the second subset each contain three lateral branches.

* * * * *